US010957677B2

(12) United States Patent
Kuwahata et al.

(10) Patent No.: US 10,957,677 B2
(45) Date of Patent: Mar. 23, 2021

(54) MODULES CONFIGURED TO EMIT AND RECEIVE LIGHT IN ADJACENT DIRECTIONS

(71) Applicant: FANUC CORPORATION, Yamanashi (JP)

(72) Inventors: Shinichi Kuwahata, Yamanashi (JP); Yoshiyuki Kubo, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/171,502

(22) Filed: Oct. 26, 2018

(65) Prior Publication Data
US 2019/0181127 A1   Jun. 13, 2019

(30) Foreign Application Priority Data
Dec. 12, 2017   (JP) .................................. 2017-238011

(51) Int. Cl.
*H01L 25/16*      (2006.01)
*G02B 6/42*       (2006.01)
(52) U.S. Cl.
CPC .............. *H01L 25/167* (2013.01); *G02B 6/42* (2013.01); *H01L 25/165* (2013.01)
(58) Field of Classification Search
CPC ................ H01L 25/167; H01L 25/165; H04B 10/801–803; H04B 10/803; H04B 10/1121
See application file for complete search history.

(56) References Cited

U.S. PATENT DOCUMENTS 6,650,808 B1    11/2003  Vujcic
2015/0280835 A1*  10/2015  Kajiyama ............. H01L 31/167
                                                   257/82

FOREIGN PATENT DOCUMENTS

| CN | 1771471 A | 5/2006 |
| JP | H02-015679 A | 1/1990 |
| JP | H09-284228 A | 10/1997 |
| JP | 2001-196625 A | 7/2001 |
| JP | 2002-350654 A | 12/2002 |

(Continued)

OTHER PUBLICATIONS

An Office Action mailed by the Japanese Patent Office dated Oct. 15, 2019, which corresponds to Japanese Patent Application No. 2017-238011 and is related to U.S. Appl. No. 16/171,502; with Enlgish language translation.

(Continued)

*Primary Examiner* — Suberr L Chi
(74) *Attorney, Agent, or Firm* — Studebaker & Brackett PC

(57) ABSTRACT

A plurality of modules are included by an electronic device, so as to be disposed adjacent to each other. Each of the modules includes a light emitting element configured to emit communication light toward an adjacent module disposed in one adjacent direction, and a light receiving element configured to receive communication light emitted by an adjacent module disposed in the other adjacent direction. Each of the modules disposed adjacent to each other is capable of emitting the communication light to the light receiving element of the adjacent module disposed in the one adjacent direction, and capable of receiving the communication light emitted by the light emitting element of the adjacent module disposed in the other adjacent direction.

6 Claims, 13 Drawing Sheets

(56) References Cited

FOREIGN PATENT DOCUMENTS

| JP | 2005-284286 A | 10/2005 |
|----|---------------|---------|
| JP | 2007-240833 A | 9/2007 |
| JP | 2008-160251 A | 7/2008 |
| JP | 4844383 B2 | 12/2011 |

OTHER PUBLICATIONS

An Office Action mailed by China National Intellectual Property Administration dated Jul. 3, 2020, which corresponds to Chinese Patent Application No. 201811474353.X and is related to U.S. Appl. No. 16/171,502 with English language translation.

* cited by examiner

MODULES CONFIGURED TO EMIT AND RECEIVE LIGHT IN ADJACENT DIRECTIONS

This application is based on and claims the benefit of priority from Japanese Patent Application No. 2017-238011, filed on 12 Dec. 2017, the content of which is incorporated herein by reference.

BACKGROUND OF THE INVENTION

Field of the Invention

The present invention relates to a module and an electronic device.

Related Art (Conventional Module)

A conventional module and a conventional electronic device are described with reference to FIG. 13. An electronic device such as a control device as shown in FIG. 13 is proposed, which is configured with a plurality of modules 102 disposed adjacent to each other. Each of the modules 102 is configured so as to accommodate an electronic board 103 such as a circuit board in a box-shaped casing 104. Communication between adjacent modules 102, 102 is performed via an electrical contact 105.

Another Prior Art

The following module and electronic device are known. Patent Document 1 discloses that each module includes a light emitting element for emitting communication light and a light receiving element for receiving communication light in an optical communication cell having two windows. The optical communication cell is formed across a plurality of modules. In the optical communication cell, communication light emitted by an arbitrary light emitting element is received by a light receiving element of a transmission destination, whereby communication between modules is performed.

Patent Document 2 discloses a module in which communication light emitted by a light emitting element is reflected by one reflecting surface of a reflecting mirror, and is then incident on one optical fiber, and the communication light emitted by the other optical fiber is reflected by the other reflecting surface of the reflecting mirror, and is then received by a light receiving element.

Patent Document 1: Japanese Unexamined Patent Application, Publication No. H09-284228

Patent Document 2: Japanese Unexamined Patent Application, Publication No. 2007-240833

SUMMARY OF THE INVENTION

Such an electronic device in which communication between a plurality of modules is performed via electrical contacts as described above has a problem in that attachment and detachment (putting in and taking out) of a module, vibration and impact cause contact wear, resulting in deteriorating the communication quality thereof. The electronic device has another problem in that aged deterioration such as oxidation of the surface of a contact lowers the communication quality.

The electronic device of Patent Document 1 has another problem in that in the case where the electronic device is designed to have a larger number of stacked modules, the optical communication cell is required to be extended, whereby the structure thereof becomes complicated. In the case where the electronic device is designed to have a larger number of stacked modules and to extend the optical communication cell, an optical path is lengthen between the modules distant from each other, whereby the communication quality may be lowered.

The module of Patent Document 2 has another problem in that the structure itself is complicated. In the module, communication light is emitted toward the direction orthogonal to the stacking direction of the modules, and communication light is emitted from the direction orthogonal to the stacking direction of the modules, whereby communication is not performed with its adjacent module unless the optical path of the communication light is bent. Accordingly, there is a problem in that the complicated structure for bending the optical path is required.

The object of the present invention is to provide a module and an electronic device each hardly deteriorating in communication quality even by attachment and detachment (putting in and taking out) of a module, vibration, impact and aged deterioration, and each hardly deteriorating in communication quality because of a structure being less complicated even by increasing the number of stacked modules.

(1) The present invention relates a plurality of modules (for example, modules 2 to be described below) included by an electronic device (for example, an electronic device 1 to be described below), so as to be disposed adjacent to each other. Each of the modules includes a light emitting element (for example, a light emitting element 5 to be described below) configured to emit a communication light (for example, a communication light 1, a communication light L1 to be described below) toward an adjacent module disposed in one adjacent direction (for example, an adjacent direction D to be described below), and a light receiving element (for example, a light receiving element 6 to be described below) configured to receive a communication light (for example, a communication light L, a communication light L2 to be described below) emitted by an adjacent module disposed in the other adjacent direction. Each of the modules disposed adjacent to each other is capable of emitting the communication light to the light receiving element of the adjacent module disposed in the one adjacent direction, and capable of receiving the communication light emitted by the light emitting element of the adjacent module disposed in the other adjacent direction.

(2) Each of the modules according to (1) may further include a casing (for example, a casing 4 to be described below) having a transparent part (for example, a transparent part 7 to be described below) and an electronic board (for example, an electronic board 3 to be described below) accommodated in the casing. The light emitting element and the light receiving element may be mounted on the electronic board. The communication light emitted by the light emitting element and the communication light to be received by the light receiving element may pass through the transparent part.

(3) In each of the modules according to (2), the transparent part may be a transparent hole.

(4) Each of the modules according to any one of (1) to (3) may further include a light guide member (for example, a light guide member 8, a light guide member 81 to be described below) allowing the communication light emitted by the light emitting element to propagate.

(5) Each of the modules according to (4) may further include a casing having a transparent hole. An emission end of the light guide member allowing the communication light emitted by the light emitting element to propagate may protrude outward from the transparent hole. The light receiving element may be disposed inside the transparent hole.

(6) Each of the modules according to any one of (1) to (5) may further include a light guide member (for example, a light guide member 8, a light guide member 82 to be described below) allowing the communication light to be received by the light receiving element to propagate.

(7) Each of the modules according to (6) may further include a casing having a transparent hole. The light emitting element may be disposed inside the transparent hole. An incident end of the light guide member allowing the communication light to be received by the light receiving element to propagate may protrude outward from the transparent hole.

(8) Each of the modules according to any one of (4) to (7) may further include a casing having a transparent hole. The casing and the light guide member protruding outward from the transparent hole may be integrated by two-color molding.

(9) In each of the modules according to any one of (4) to (8), a portion (for example, a portion 85 to be described below) close to a central axis in the light guide member may have higher refractive index than a portion (for example, a portion 86, a portion 87 to be described below) distant from the central axis.

(10) In each of the modules according to any one of (4) to (9), each of end surfaces of the light guide member may be a convex (for example, a convex 88 to be described below) having a focal point on the light emitting element or the light receiving element.

(11) In each of the modules according to any one of (1) to (10), the light emitting element and the light receiving element may be configured integrally.

The invention relates to an electronic device configured with the plurality of modules disposed adjacent to each other according to any one of (1) to (11). The light receiving element receives the communication light emitted by the light emitting element between the adjacent modules, thereby performing communication.

(13) In the electronic device according to (12), each of the modules may include a casing having a transparent hole. A light guide member protruding outward from the transparent hole of the casing may be disposed inside the casing of the adjacent module via the transparent hole of the casing, so as to be located in a vicinity of the light receiving element or the light emitting element.

The present invention enables to provide a module and an electronic device each hardly deteriorating in communication quality even by attachment and detachment (putting in and taking out) of a module, vibration, impact and aged deterioration, and each hardly deteriorating in communication quality because of a structure being less complicated even by increasing the number of stacked modules.

DETAILED DESCRIPTION OF THE INVENTION

Figure 1:
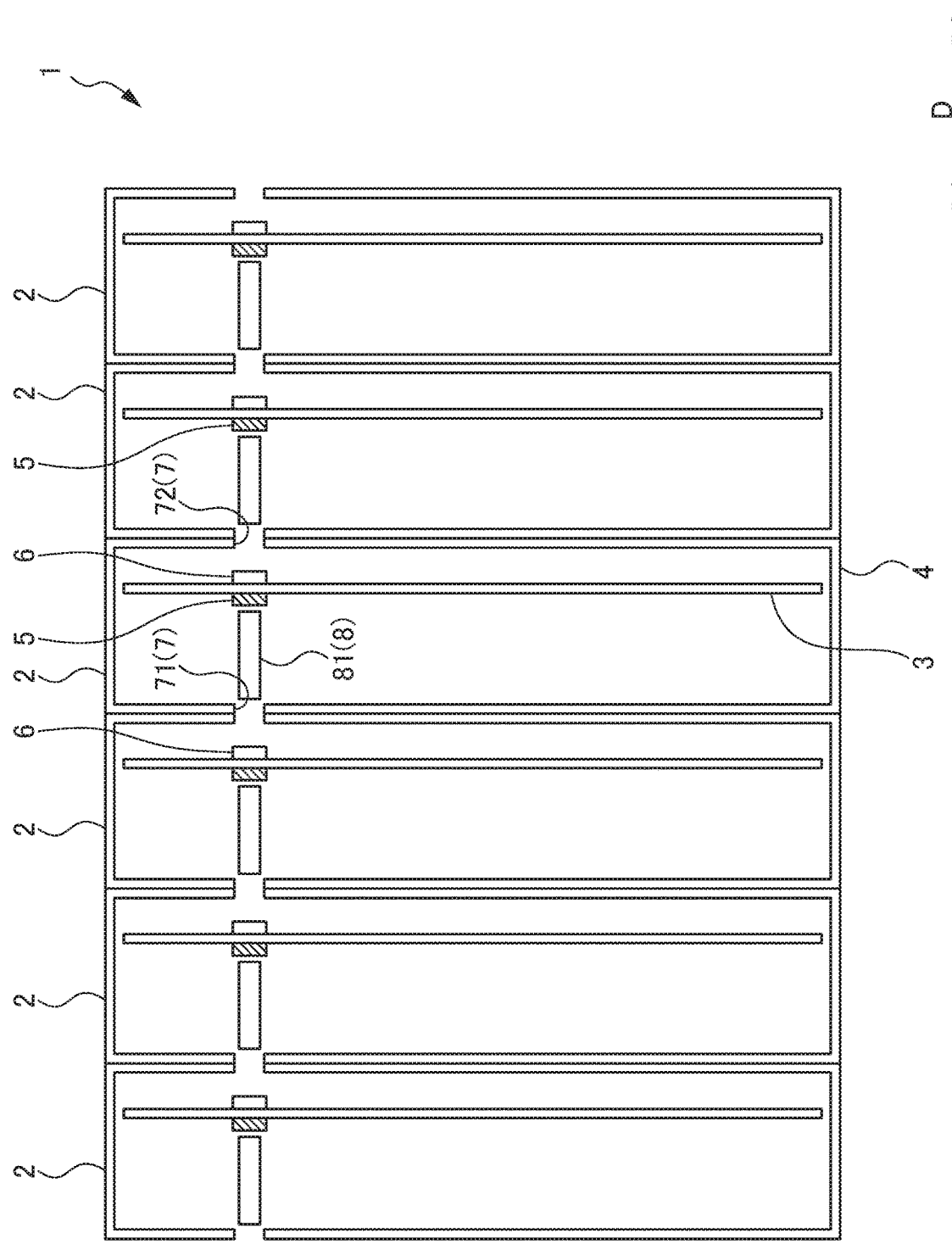
FIG. 1 is a diagram illustrating a module and an electronic device according to a first embodiment.

Some embodiments of the present invention will be described below with reference to the drawings. In the descriptions of a second embodiment and subsequent embodiments, the same reference numerals are assigned to the configurations common to a first embodiment, and the descriptions thereof will be omitted.

First Embodiment

Figure 2:
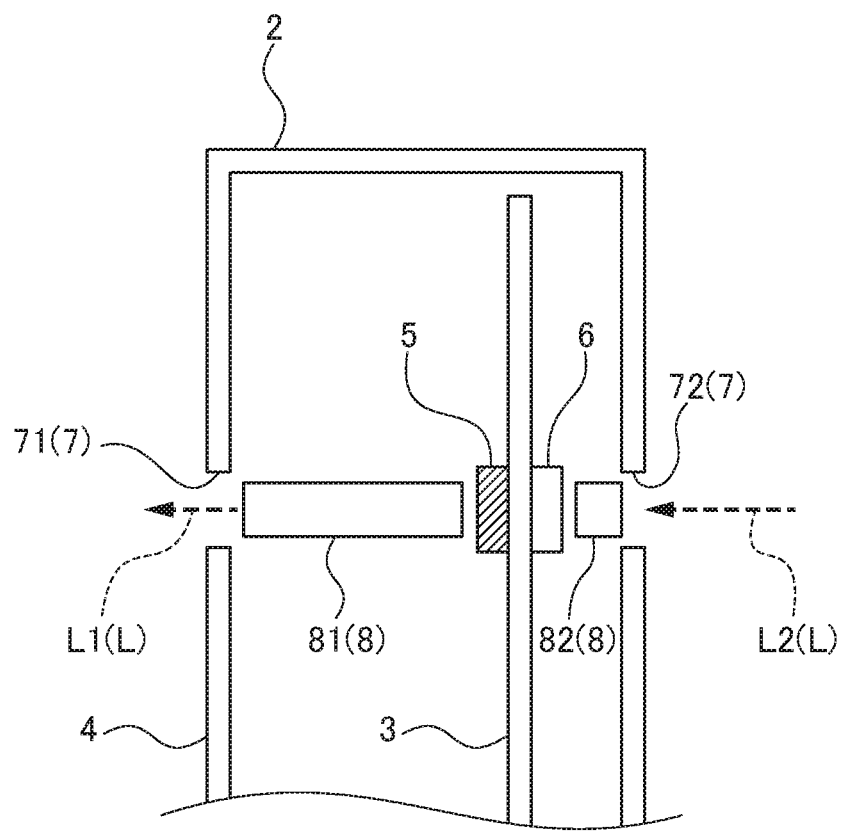
FIG. 2 is a partially enlarged view illustrating the module according to the first embodiment.

The first embodiment of the present invention is described with reference to FIG. 1 and FIG. 2. As shown in FIG. 1, an electronic device 1 is configured with a plurality of modules 2 disposed adjacent to each other, of the present embodiment. The direction in which the plurality of modules 2 are adjacent is referred to as "adjacent direction D." For the sake of convenience with regard to the adjacent direction D, a "first adjacent direction D1" is distinguished from a "second adjacent direction D2" opposed to the first adjacent direction D1, in some cases.

Each of the modules 2 includes one or a plurality of electronic boards 3 (such as a circuit board) and a substantially box-shaped casing 4 for accommodating the electronic board 3. It is noted that the present invention is not limited to the configuration, and a module may be configured only with the electronic board 3, without the casing 4.

A predetermined circuit pattern is formed on the electronic board 3, and a plurality of electronic elements are mounted on the circuit pattern. Various electronic circuits, such as a signal processing circuit, a control circuit and a communication interface, are each configured with such a circuit pattern and electronic elements.

A light emitting element 5 for emitting a communication light L1 (L) toward one adjacent direction D is mounted on one surface of the electronic board 3. A light receiving element 6 for receiving a communication light L2 (L) from the other adjacent direction D is mounted on the other surface of the electronic board 3. The communication light L is the light which has been modulated in intensity on the basis of a predetermined communication signal. It is noted that in the first embodiment, although the one adjacent direction D corresponds to the first adjacent direction D1, while the other adjacent direction D corresponds to the second adjacent direction D2, the present invention is not limited thereto. The one adjacent direction D may correspond to the second adjacent direction D2, while the other adjacent direction D may correspond to the first adjacent direction D1. As in the third and fourth embodiments to be described below, in some cases, the communication light L may be emitted in the both directions of the first adjacent direction D1 and the second adjacent direction D2, and further the communication light L may be received from the both directions of the first adjacent direction D1 and the second adjacent direction D2.

The thickness direction of the electronic board 3 coincides with the adjacent direction D. The light emitting element 5 and the light receiving element 6 are connected to the communication interface configured on the electronic board 3. The communication interface modulates the intensity of the light to be emitted by the light emitting element 5 on the basis of a transmission signal. The communication interface also demodulates the light having been received by the light receiving element 6 into a reception signal.

In each of the modules 2, the light emitting element 5 emits the communication light L1 (L) to the light receiving element 6 of another electronic device 1 disposed in the first adjacent direction D1. In each of the modules 2, the light receiving element 6 receives the communication light L2 (L) emitted by the light emitting element 5 of another electronic device 1 disposed in the second adjacent direction D2.

The communication light L1 (L) emitted by the light emitting element 5 passes through a transparent part 71 (7) disposed on the casing 4. The communication light L2 (L) to be received by the light receiving element 6 passes through a transparent part 72 (7) disposed on the casing 4. The transparent parts 71 (7), 72 (7) are respectively disposed on the both sides of the casing 4 in the adjacent direction D. Each of the transparent parts 71 (7), 72 (7) may be configured with a transparent hole (through hole). In other words, transparent parts 71 (7) and 72 (7) shown in FIG. 1 are also transparent holes or through holes 71(7) and 72 (7) in FIG. 1. Alternatively, each of the transparent parts 71 (7), 72 (7) may be configured with a transparent hole closed by a transparent plate.

The electronic device 1 in the present embodiment is configured by disposing the plurality of modules 2 described above in the adjacent direction D. In the electronic device 1, each of the light receiving elements 6 receives the communication light L emitted by each of the light emitting elements 5 between the modules 2, 2 disposed adjacent to each other in the adjacent direction D, thereby performing communication.

It is noted that the communication light L1 (L) emitted by the leftmost module 2 shown in FIG. 1 may be transmitted to another electronic device not shown, or may be transmitted to the light receiving element 6 of the rightmost module 2 shown in FIG. 1 via an optical fiber not shown. The communication light 12 (L) to be received by the rightmost module 2 shown in FIG. 1 may be the communication light emitted by another electronic device not shown. The communication light L1 (L) emitted by the leftmost module 2 shown in FIG. 1 may be transmitted to the rightmost module 2 shown in FIG. 1 via an optical fiber not shown.

Each of the modules 2 may have a light guide member 81 (8) allowing the communication light L1 (L) emitted by the light emitting element 5 to propagate. As shown in FIG. 2, each of the modules 2 may have a light guide member 82 (8) allowing the communication light 12 (1) to be received by the light receiving element 6 to propagate. The light guide members 81 (8), 82 (8) may be disposed for only either one of the light emitting element 5 and the light receiving element 6, or may be disposed for the both.

Each of the light guide members 81 (8), 82 (8) is made of transparent material. Each of the light guide members 81 (8), 82 (8) is preferably formed in a cylindrical shape. Each of the light guide members 81 (8), 82 (8) guides the communication light incident from one end face thereof, and emits the light from the other end face. The transparent material constituting the light guide members 81 (8), 82 (8) is preferably a colorless highly-transparent synthetic resin material, such as acryl (PMMA: Polymethyl methacrylate) or polycarbonate (PC).

(Effects Produced by Present Embodiment)

The present embodiment produces the following effects, as examples. Each of the modules 2 of the present embodiment included by the electronic device 1 so as to be disposed adjacent to each other includes the light emitting element 5 configured to emit the communication light L (L1) toward the adjacent module 2 disposed in one adjacent direction D, and the light receiving element 6 configured to receive the communication light (L2) emitted by the adjacent module 2 disposed in the other direction D. Each of the modules 2 disposed adjacent to each other is capable of emitting the communication light L (L1) to the light receiving element 6 of the adjacent module 2 disposed in the one adjacent direction D, and capable of receiving the communication light L (L2) emitted by the light emitting element 5 of the adjacent module 2 disposed in the other adjacent direction D.

Therefore, communication between the modules 2, 2 in the present embodiment is performed by a non-contact communication method using the communication light L. Accordingly, the modules 2 hardly deteriorate in communication quality even by attachment and detachment (putting in and taking out) of the module 2, vibration, impact and aged deterioration, and hardly deteriorate in communication quality because of the structure thereof being less complicated even by increasing the number of stacked modules 2.

Second Embodiment

Figure 3:
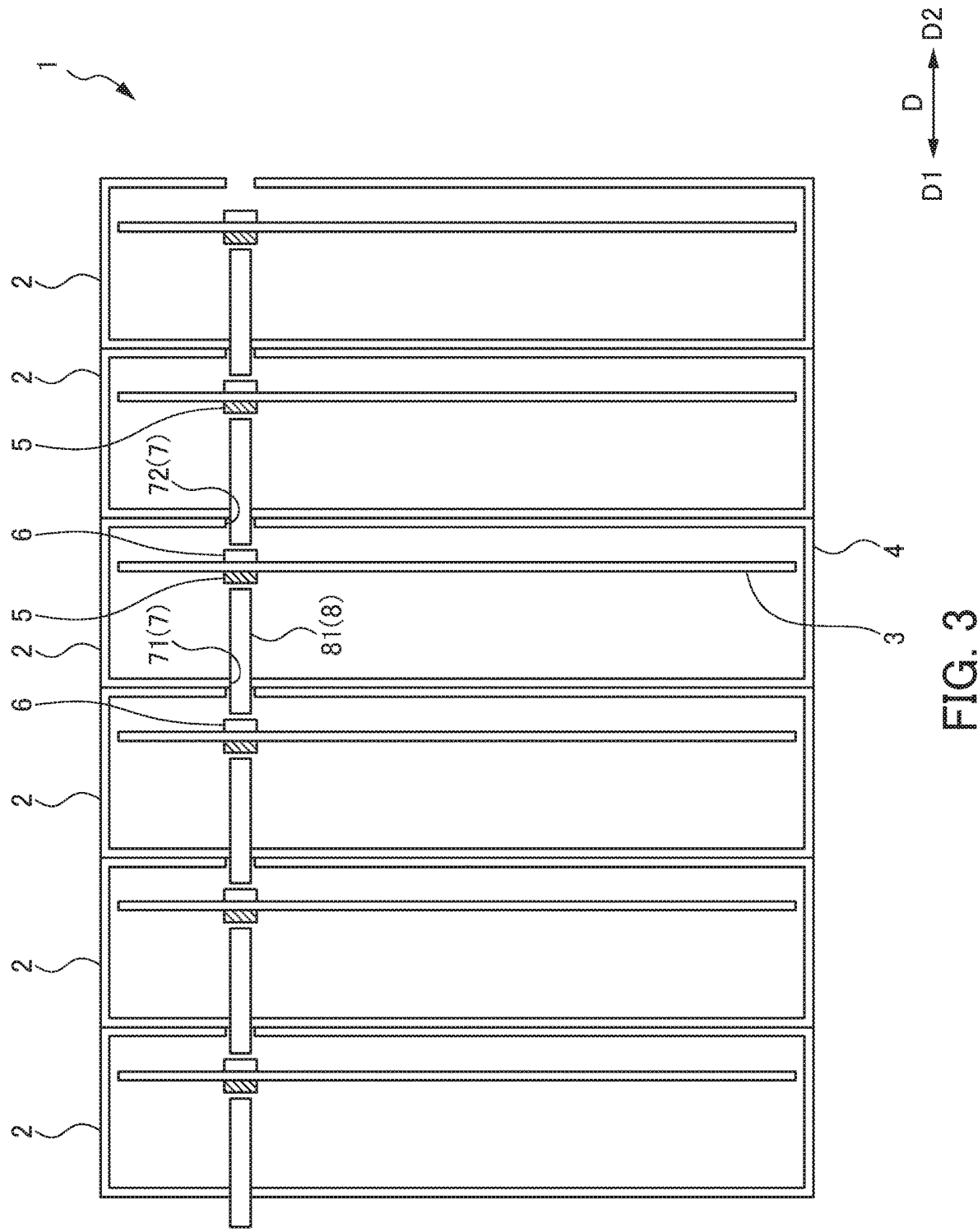
FIG. 3 is a diagram illustrating a module and an electronic device according to a second-1 embodiment.

The second-1 embodiment, the second-2 embodiment and the second-3 embodiment of the present invention are described below with reference to FIG. 3, FIG. 4 and FIG. 5, respectively. As shown in FIG. 3, in each of the modules 2 of the second-1 embodiment, the emission end of the light guide member 81 (8) allowing the communication light L1 (L) emitted by the light emitting element 5 to propagate protrudes outward from the transparent part (transparent hole) 71 (7) disposed on the casing 4. The light receiving element 6 is disposed inside the transparent part (transparent hole) 72 (7) disposed on the casing 4.

In the electronic device 1 in which the plurality of modules 2 are disposed adjacent to each other, the light guide member 81 (8) protruding outward from the transparent hole 71 (7) is disposed inside the casing 4 of the adjacent module 2 via the transparent hole 72 (7) disposed on the casing 4 so as to reach the vicinity of the light receiving element 6, thereby enabling to secure high communication quality. The terminology of "vicinity" indicates a short distance enough to secure high communication quality.

Figure 4:
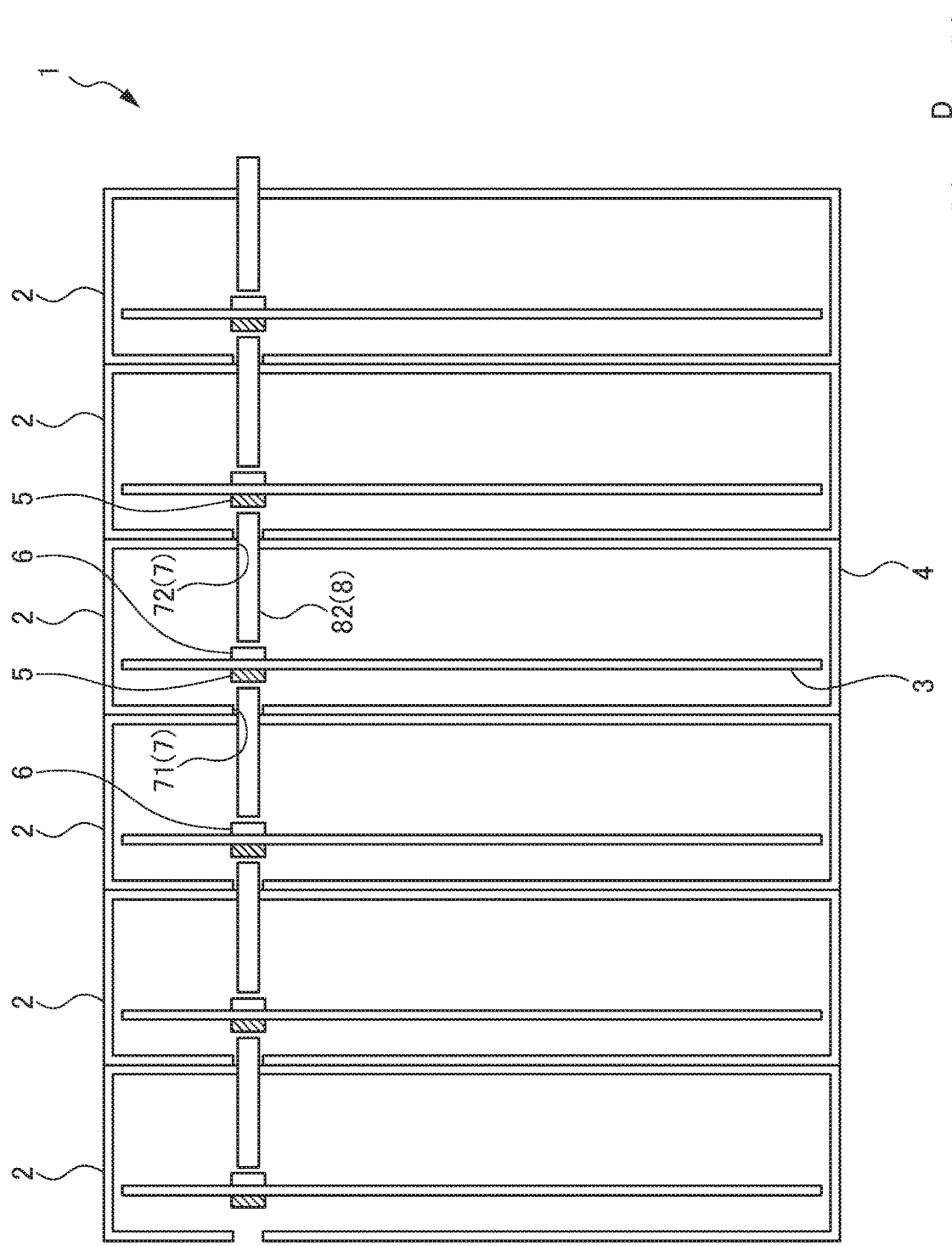
FIG. 4 is a diagram illustrating a module and an electronic device according to a second-2 embodiment.

As shown in FIG. 4, in each of the modules 2 of the second-2 embodiment, the incidence end of the light guide member 82 (8) allowing the communication light 12 (L) to be received by the light receiving element 6 to propagate may protrude outward from the transparent hole 72 (7)

disposed on the casing 4. In this case, the light emitting element 5 is disposed inside the transparent hole 71 (7) disposed on the casing 4.

In this case, in the electronic device 1 in which the plurality of modules 2 are disposed adjacent to each other, the light guide member 82 (8) protruding outward from the transparent hole 72 (7) is disposed inside the casing 4 of the adjacent module 2 via the transparent hole 71 (7) disposed on the casing 4 so as to reach the vicinity of the light emitting element 5, thereby enabling to secure high communication quality.

Two-color molding (double molding) enables to integrate the casing 4 and the light guide member 81 (8) or the light guide member 82 (8) protruding outward from the transparent hole 71 (7) or the transparent hole 72 (7) disposed on the casing 4. The two-color molding herein is the molding method in which one of two different types of resin material is subjected to molding first, and thereafter the other is subjected to molding by use of the same mold. It is noted that the whole or a part of the casing 4 may be made of the same transparent material as the light guide member 81 (8) or the light guide member 82 (8), thereby enabling to perform integral molding with the light guide member 81 (8) or the light guide member 82 (8). The casing 4 and the light guide member 81 (8) or the light guide member 82 (8) are integrally molded in this manner, thereby enabling to omit the work of attaching the light guide member 81 (8) or the light guide member 82 (8) into the casing 4.

Figure 5:
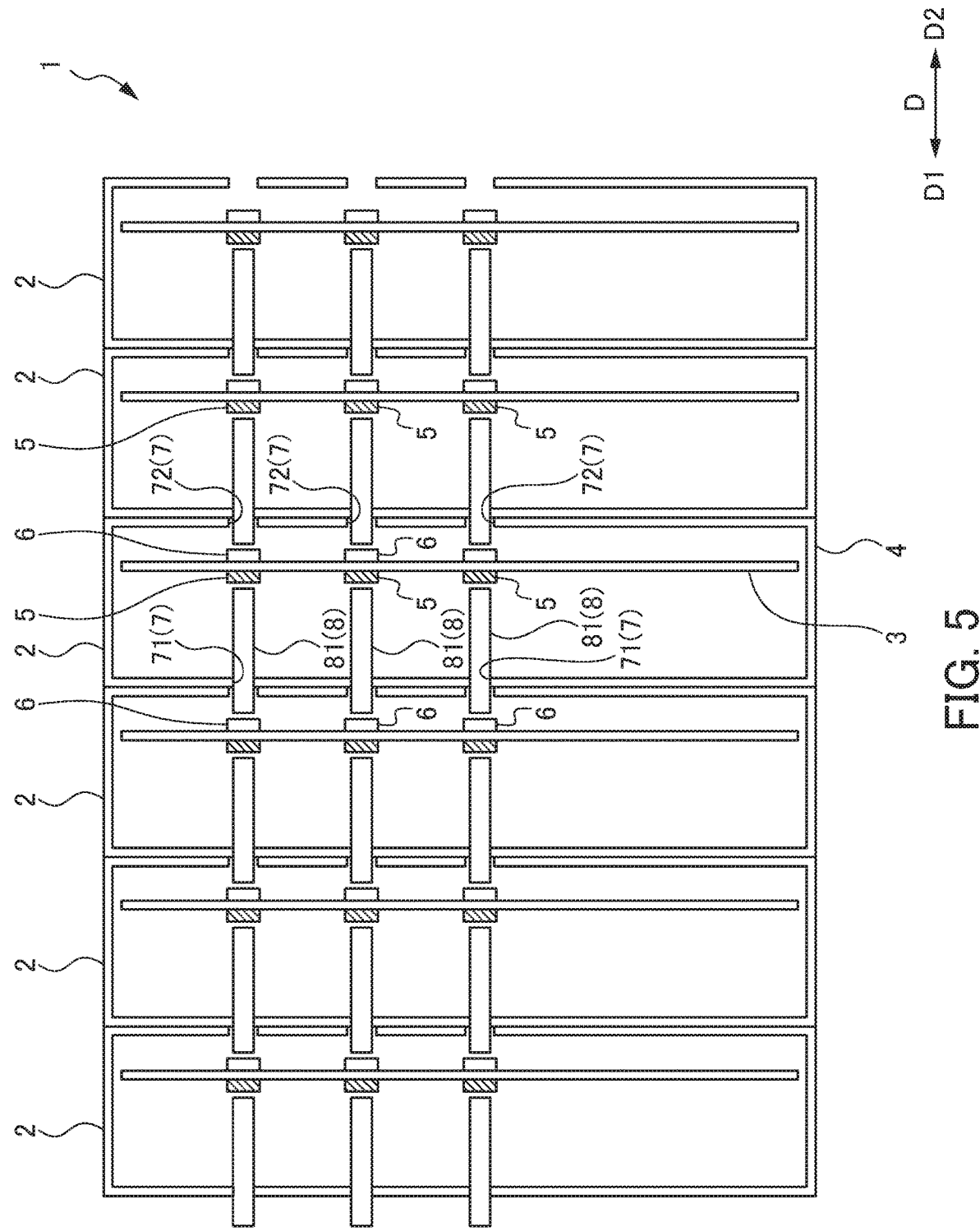
FIG. 5 is a diagram illustrating a module and an electronic device according to a second-3 embodiment.

As shown in FIG. 5, in each of the modules 2 of the second-3 embodiment, a plurality of the light emitting elements 5 and a plurality of the light receiving elements 6 are respectively mounted on the electronic board 3, and a plurality of lines of communication paths are disposed (in parallel). In FIG. 5, three light emitting elements 5 and three light receiving elements 6 are mounted on the front and back surfaces of the electronic board 3, respectively, and three lines of communication paths are disposed. The communication paths are disposed in a plurality of lines in this manner, thereby enabling to increase the communication capacity.

Third Embodiment

Figure 6:
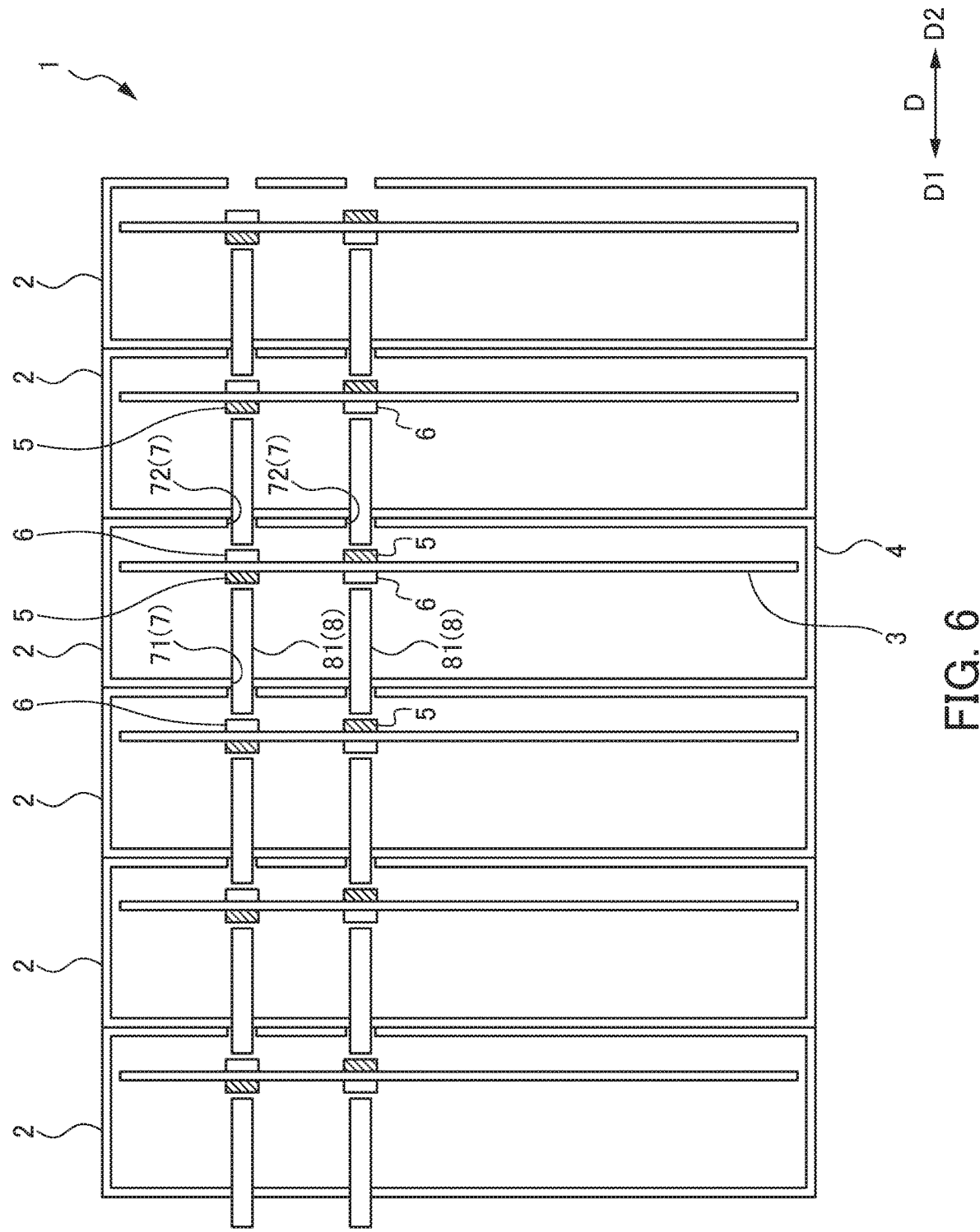
FIG. 6 is a diagram illustrating a module and an electronic device according to a third embodiment.

The third embodiment of the present invention is described with reference to FIG. 6. As shown in FIG. 6, in each of the modules 2 of the present embodiment, the light emitting element 5 for emitting the communication light L1 (L) toward the first adjacent direction D1, and the light receiving element 6 for receiving the communication light L2 (L) from the first adjacent direction D1 are mounted on one surface of the electronic board 3. Further, the light emitting element 5 for emitting the communication light L1 (L) toward the second adjacent direction D2, and the light receiving element 6 for receiving the communication light L2 (L) from the second adjacent direction D2 are mounted on the other surface of the electronic board 3.

Each of the modules 2 is capable of emitting the communication light L1 (L) to the light receiving element 6 of the adjacent module 2 disposed in the first adjacent direction. D1, and capable of receiving the communication light L2 (L) emitted by the light emitting element 5 of the adjacent module 2. Further, each of the modules 2 is capable of emitting the communication light L1 (L) to the light receiving element 6 of the adjacent module 2 disposed in the second adjacent direction D2, and capable of receiving the communication light L2 (L) emitted by the light emitting element 5 of the adjacent module 2. That is, each of the modules 2 is capable of performing transmission and reception with the adjacent modules 2 disposed in the both sides of the first adjacent direction D1 and the second adjacent direction D2, thereby enabling to perform full duplex communication.

Fourth Embodiment

Figure 7:
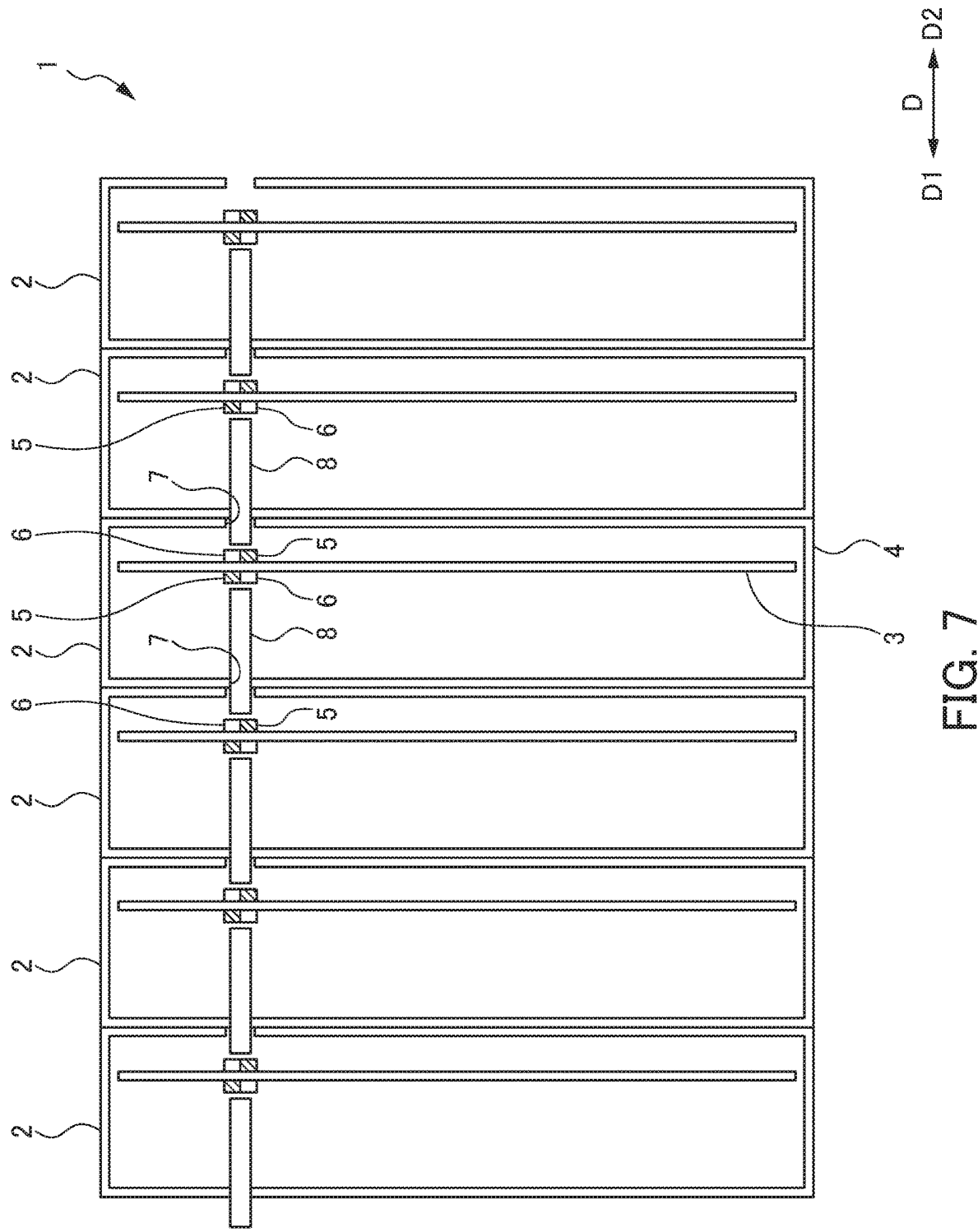
FIG. 7 is a diagram illustrating a module and an electronic device according to a fourth embodiment.

The fourth embodiment of the present invention is described with reference to FIG. 7. In each of the modules 2 of the present embodiment, the light emitting element 5 mounted on one surface of the electronic board 3 to emit the communication light L1 (L) toward the first adjacent direction D1 is configured integrally with the receiving element 6 for receiving the communication light L2 (L) from the first adjacent direction D1. Further, the light emitting element 5 mounted on the other surface of the electronic board 3 to emit the communication light L1 (L) toward the second adjacent direction D2 is configured integrally with the receiving element 6 for receiving the communication light L2 (L) from the second adjacent direction D2. In such a manner, an element in which the light emitting element 5 and the light receiving element 6 are configured integrally is mounted on each of the front and back surfaces of the electronic board 3. This allows each of the modules 2 to perform transmission and reception with the adjacent modules 2 disposed in the both sides of the first adjacent direction D1 and the second adjacent direction D2, thereby enabling to perform half-duplex communication.

In the case of the element in which the light emitting element 5 and the light receiving element 6 are configured integrally, one transparent part 7 can serve both for transmission and for reception. In addition, in this case, one light guide member 8 can serve both for transmission and for reception. That is, the light guide member 8 allows the communication light L1 (1) emitted by the light emitting element 5 to propagate, and also allows the communication light L2 (L) to be received by the light receiving element 6 integrally configured with the light emitting element 5 to propagate. This enables to perform duplex communication without increasing the number of the light guide members 8.

Fifth Embodiment

Figure 8:
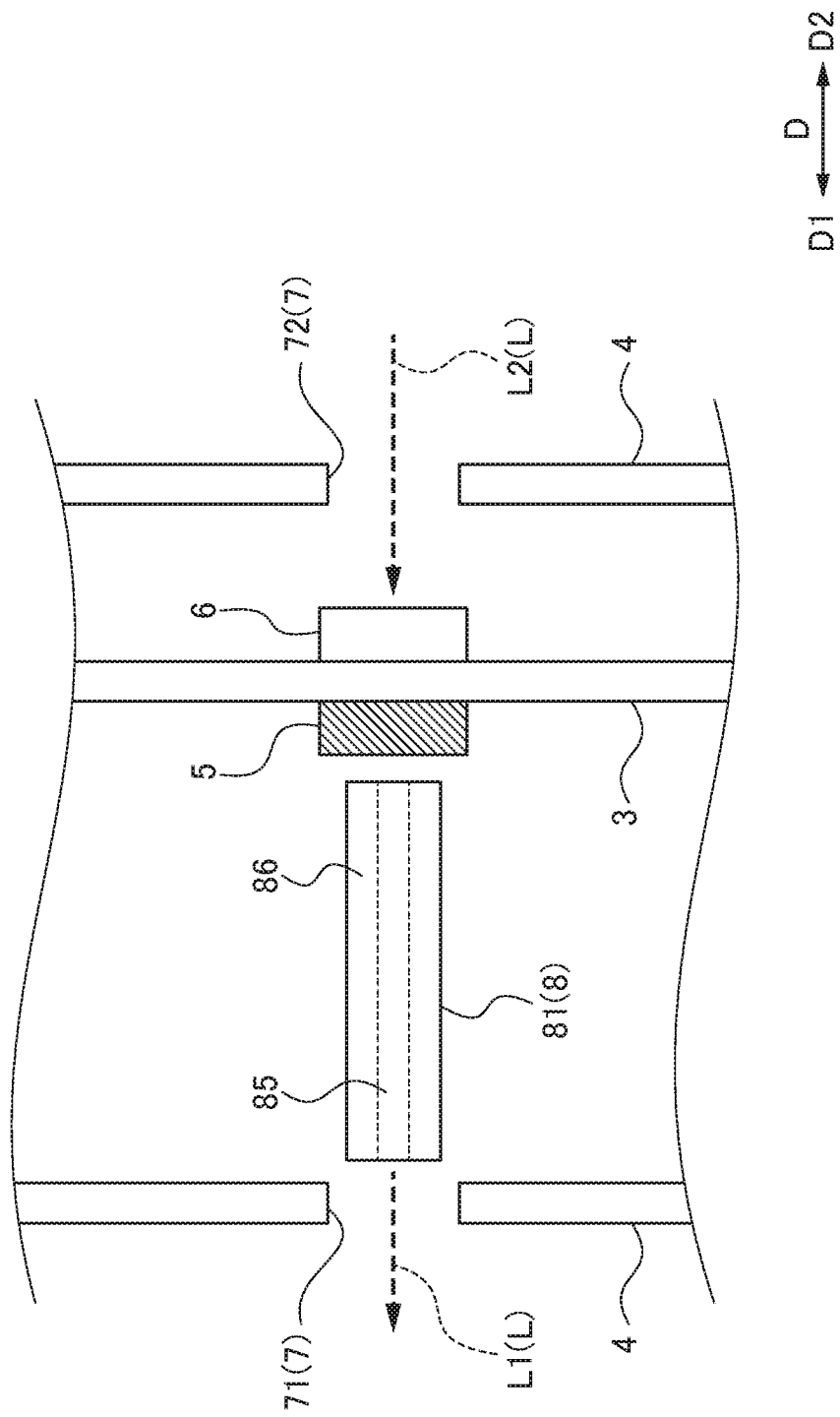
FIG. 8 is a diagram illustrating a light guide member of a module according to a fifth-1 embodiment.

The fifth-1 embodiment, the fifth-2 embodiment, the fifth-3 embodiment, the fifth-4 embodiment and the fifth-5 embodiment are described with reference to FIG. 8 to FIG. 12, respectively. As shown in FIG. 8, in the fifth-1 embodiment, a portion 85 which is close to the central axis in the light guide member 81 (8) has higher refractive index than a portion 86 which is distant from the central axis. A core (85) disposed in the central axis side is designed to have higher refractive index than a clad (86) disposed in the outer sides as in a step index type optical fiber, thereby preventing light leakage to the side surfaces of the light guide member, and thus improving communication quality. FIG. 8 shows the light guide member 81 (8) for transmission. The light guide member 82 (8) for reception may have the same configuration.

Figure 9:
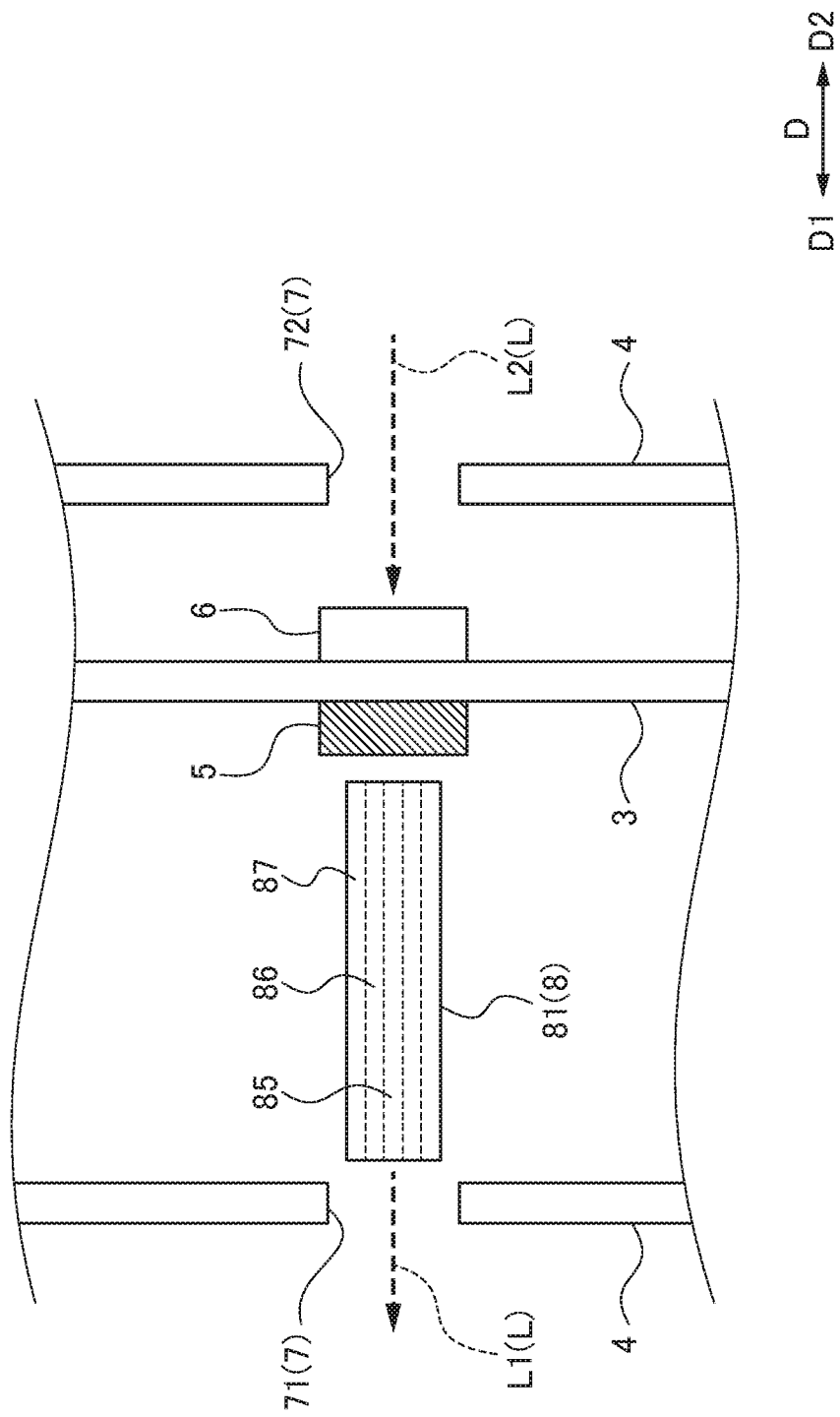
FIG. 9 is a diagram illustrating a light guide member of a module according to a fifth-2 embodiment.

As shown in FIG. 9, in the fifth-2 embodiment, the refractive indexes of the light guide members 81 (8), 82 (8) are respectively set to be lowered in the order of the portion 85 close to the central axis, the portion 86 distant from the central axis, and a portion 87 more distant from the central axis, as in a multi-step index type optical fiber having three or more layers. Also in this case, light leakage to the side surfaces of the light guide members is prevented, and communication quality is thus improved.

Figure 10:
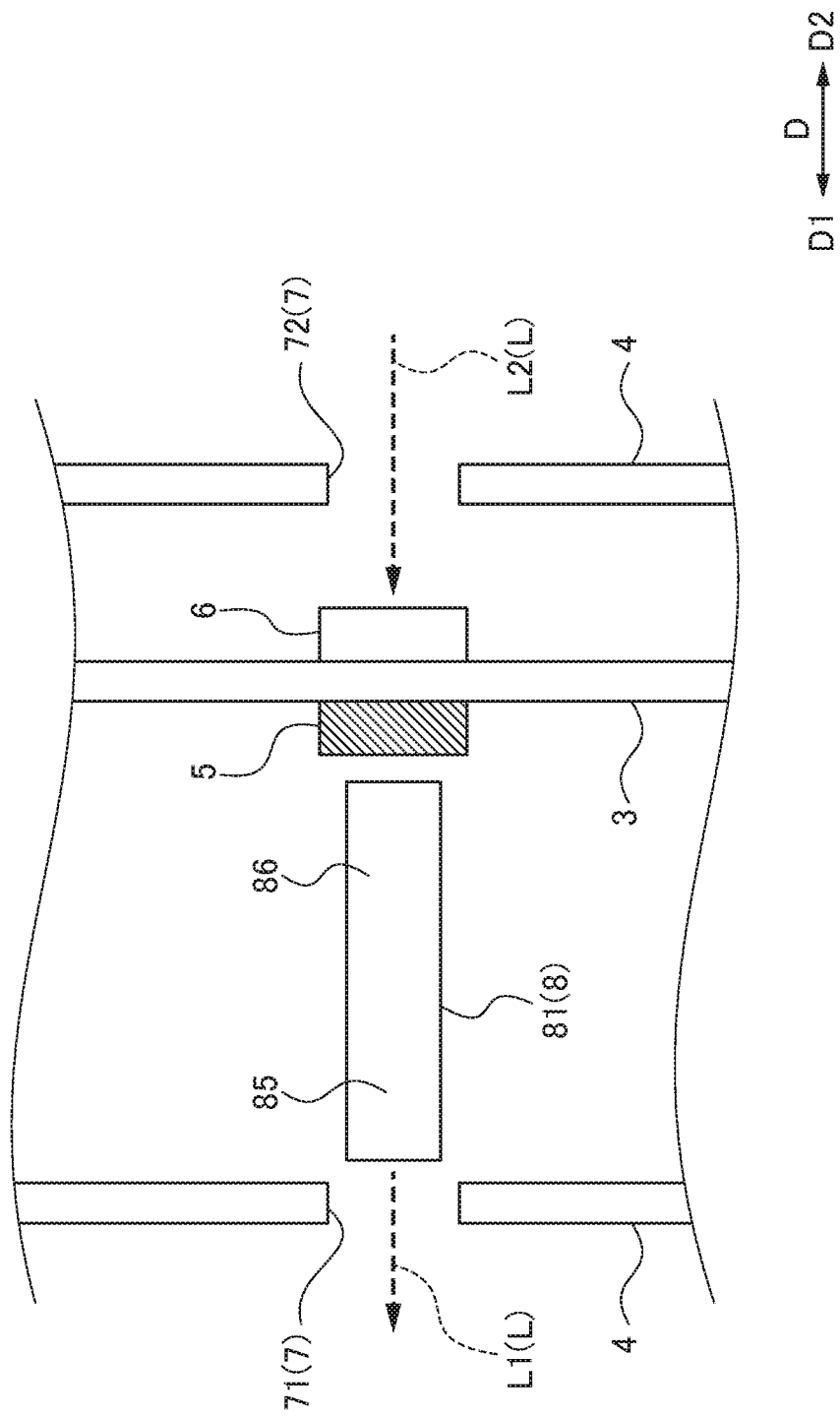
FIG. 10 is a diagram illustrating a light guide member of a module according to a fifth-3 embodiment.

As shown in FIG. 10, in the fifth-3 embodiment, the refractive indexes of the light guide members 81 (8), 82 (8) are respectively set to be steplessly lowered from the portion 85 close to the central axis toward the portion 86 distant from the central axis, as in a graded index type (refractive index distribution type) optical fiber. Also in this case, light leakage to the side surfaces of the light guide members is prevented, and communication quality is thus improved.

Figure 11:
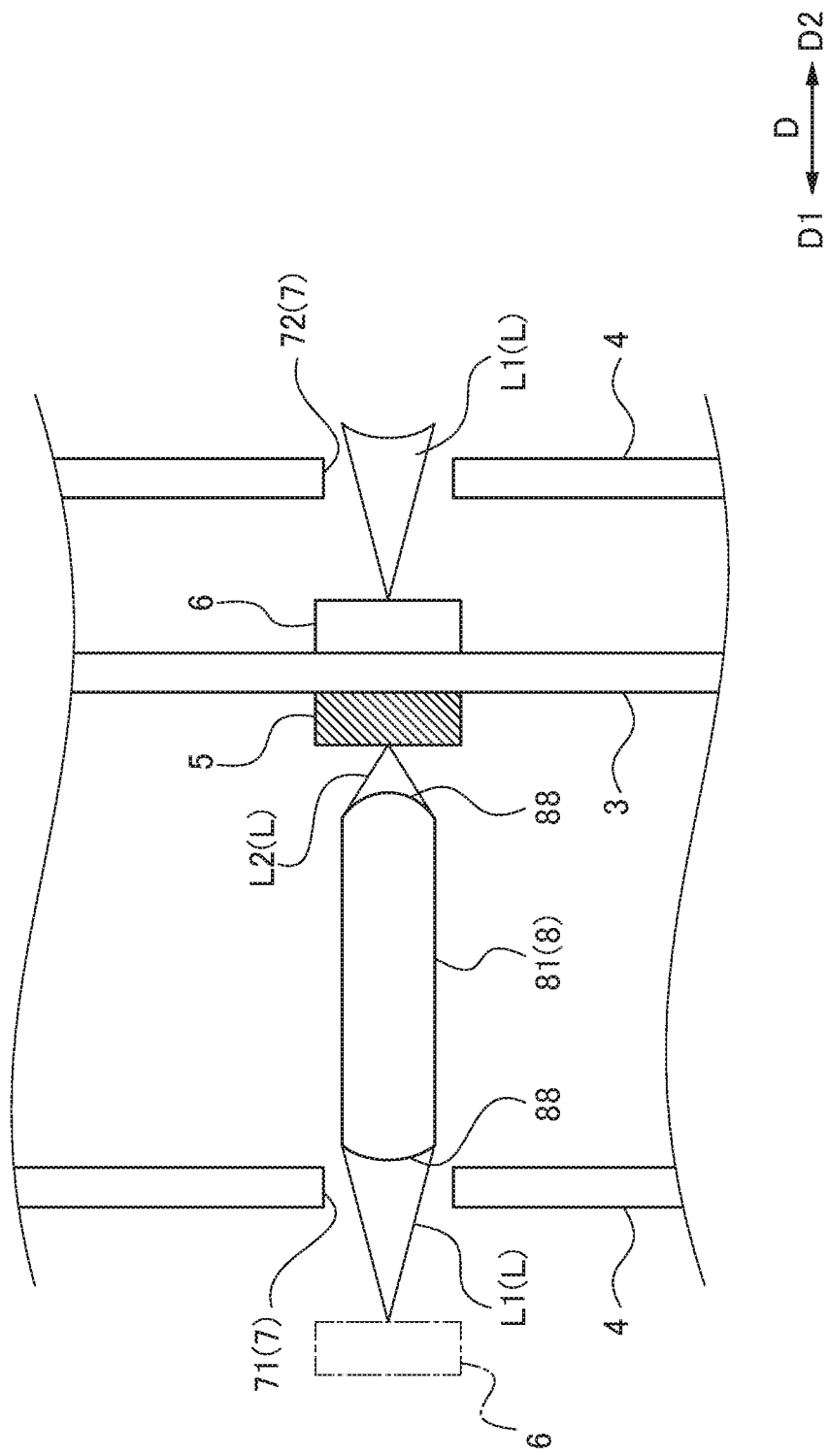
FIG. 11 is a diagram illustrating a light guide member of a module according to a fifth-4 embodiment.

As shown in FIG. 11, in the fifth-4 embodiment, the end surfaces of the light guide members 81 (8), 82 (8) are convexes (convexly curved surfaces) 88. Each of the convexes 88 is preferably formed to have a focal point on the light emitting element 5 or the light receiving element 6. The convexes 88 improve the efficiency of light emission and reception, resulting in improving the communication quality.

Figure 12:
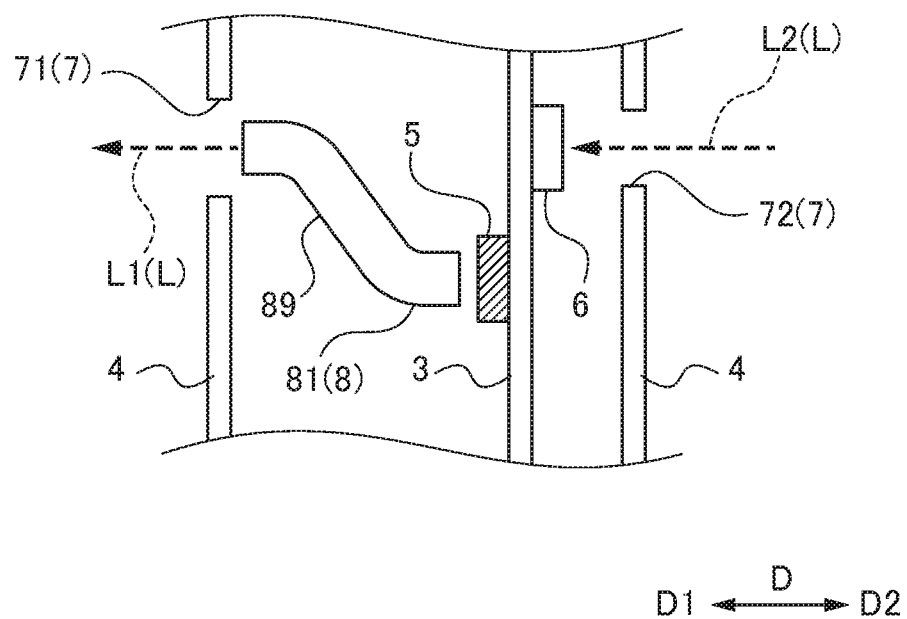
FIG. 12 is a diagram illustrating a light guide member of a module according to a fifth-5 embodiment.
Figure 13:
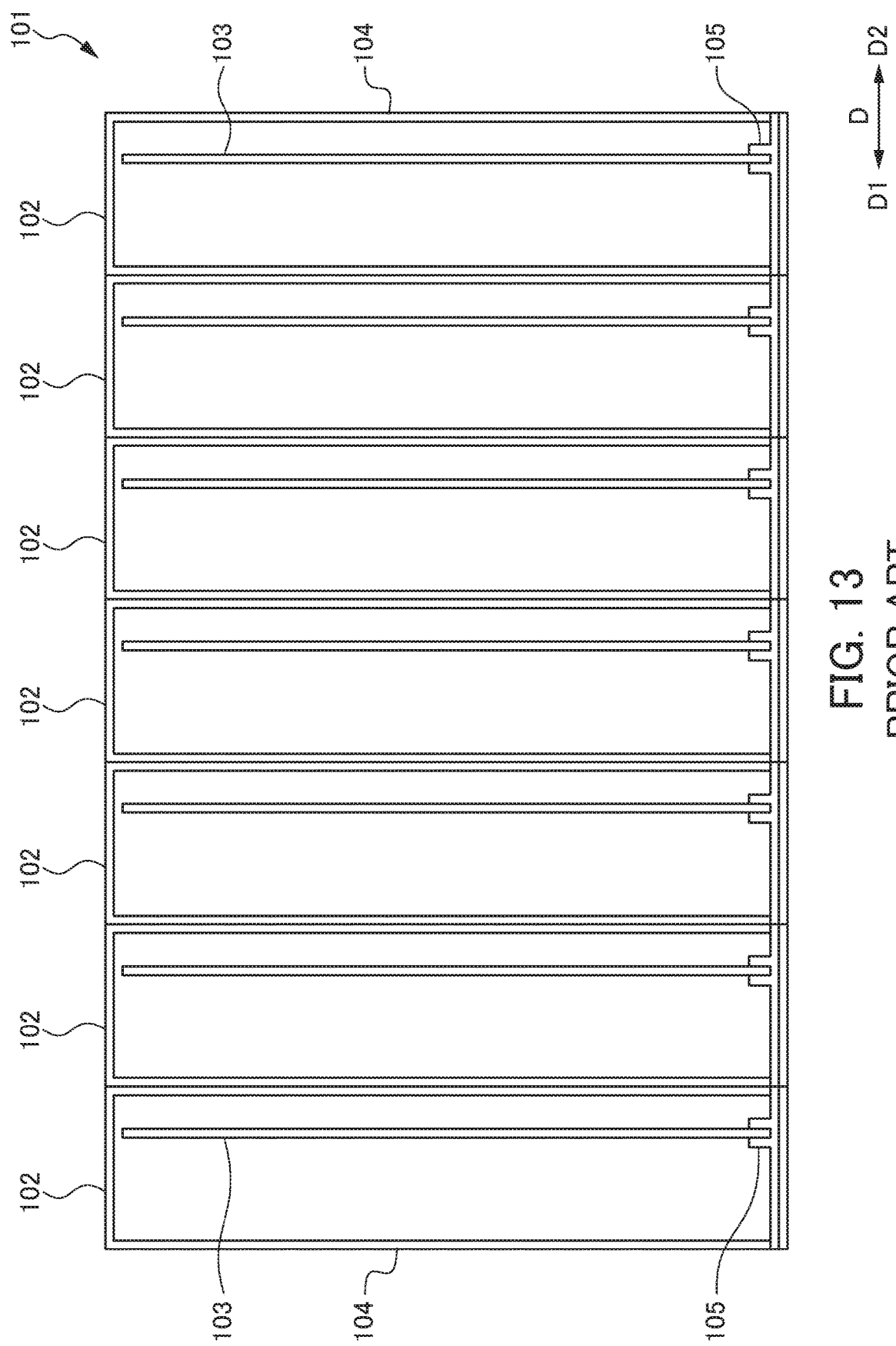
FIG. 13 is a diagram illustrating a conventional module and a conventional electronic device.

As shown in FIG. 12, in the fifth-5 embodiment, each of the light guide members 81 (8), 82 (8) is configured to be bent at a bent portion 89 corresponding to the middle portion thereof, so as to bend and guide the incident communication light. In this case, the light emitting element 5 and the light receiving element 6 are able to be disposed at different positions in the plane direction orthogonal to the adjacent direction D on the front and back surfaces of the electronic board 3, thereby improving the degree of freedom in the mounting layout of electronic elements on the electronic board (Modifications)

The present invention is not limited to the above-described embodiments, and various changes and modifications are available. The configurations of the respective embodiments may be combined.

EXPLANATION OF REFERENCE NUMERALS

1 ELECTRONIC DEVICE
2 MODULE
3 ELECTRONIC BOARD
4 CASING
5 LIGHT EMITTING ELEMENT
6 LIGHT RECEIVING ELEMENT
7, 71, 72 TRANSPARENT PART
8, 81, 82 LIGHT GUIDE MEMBER
85 PORTION CLOSE TO CENTRAL AXIS
86, 87 PORTION DISTANT FROM CENTRAL AXIS
88 CONVEX

What is claimed is:

1. A plurality of modules included by an electronic device so as to be disposed adjacent to each other, each of the modules comprising:
    a light emitting element configured to emit a communication light toward an adjacent module disposed in one adjacent direction;
    a light receiving element configured to receive a communication light emitted by an adjacent module disposed in an other adjacent direction,
    a light guide member allowing the communication light emitted by the light emitting element to propagate; and
    a casing having a transparent hole, wherein
    each of the modules disposed directly adjacent to two other modules of the plurality of modules is capable of emitting the communication light to the light receiving element of the adjacent module disposed in the one adjacent direction, and capable of receiving the communication light emitted by the light emitting element of the adjacent module disposed in the other adjacent direction, and
    an emission end of the light guide member is recessed inwardly from the transparent hole.

2. The modules according to claim 1, the modules each further comprising:
    an electronic board accommodated in the casing, wherein
    the light emitting element and the light receiving element are mounted on the electronic board, and
    the communication light emitted by the light emitting element and the communication light to be received by the light receiving element respectively pass through the transparent hole and a second transparent hole.

3. The modules according to claim 1, wherein
    a portion close to a central axis in the light guide member has a higher refractive index than that of a portion distant from the central axis.

4. The modules according to claim 1, wherein
    each of end surfaces of the light guide member is convex and has a focal point on the light emitting element or the light receiving element.

5. The modules according to claim 1, wherein
    the light emitting element and the light receiving element are configured integrally.

6. An electronic device configured with the plurality of modules disposed adjacent to each other according to claim 1, wherein
    a second light receiving element receives the communication light emitted by the light emitting element between the adjacent modules, thereby performing communication.

* * * * *